US009761670B2

(12) United States Patent
Hikita et al.

(10) Patent No.: US 9,761,670 B2
(45) Date of Patent: Sep. 12, 2017

(54) SEMICONDUCTOR DEVICE COMPOSED OF ALGAINN LAYERS WITH INACTIVE REGIONS

(71) Applicant: PANASONIC CORPORATION, Osaka (JP)

(72) Inventors: Masahiro Hikita, Toyama (JP); Manabu Yanagihara, Osaka (JP); Yasuhiro Uemoto, Toyama (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 416 days.

(21) Appl. No.: 14/133,118

(22) Filed: Dec. 18, 2013

(65) Prior Publication Data

US 2014/0103360 A1   Apr. 17, 2014

Related U.S. Application Data

(63) Continuation of application No. PCT/JP2012/004590, filed on Jul. 19, 2012.

(30) Foreign Application Priority Data

Jul. 29, 2011   (JP) ................... 2011-167333

(51) Int. Cl.
*H01L 29/812*   (2006.01)
*H01L 29/66*   (2006.01)
(Continued)

(52) U.S. Cl.
CPC .... *H01L 29/2003* (2013.01); *H01L 29/41758* (2013.01); *H01L 29/66212* (2013.01);
(Continued)

(58) Field of Classification Search
CPC ........... H01L 21/30621; H01L 29/0692; H01L 29/2003; H01L 29/205; H01L 29/41758;
(Continued)

(56) References Cited

U.S. PATENT DOCUMENTS

2006/0273347 A1* 12/2006 Hikita ................ H01L 29/7783
257/192
2008/0290372 A1* 11/2008 Makiyama .......... H01L 21/3185
257/194
(Continued)

FOREIGN PATENT DOCUMENTS

JP   2002-359256 A   12/2002
JP   2006-339561 A   12/2006
(Continued)

OTHER PUBLICATIONS

International Search Report issued in International Application No. PCT/JP2012/004590 mailed Oct. 23, 2012, 11 pgs.

*Primary Examiner* — Cheung Lee
*Assistant Examiner* — Stephen C Smith
(74) *Attorney, Agent, or Firm* — McDermott Will & Emery LLP

(57) ABSTRACT

A semiconductor device having: a substrate; a nitride semiconductor layer including a first semiconductor layer made of GaN or $In_xGa_{1-x}N$ ($0<x\le1$) and formed on the substrate and a second semiconductor layer containing Al and formed on the first semiconductor layer; and a protective film formed on the set of nitride semiconductor layers. The nitride semiconductor layer has an active section and an inactive section surrounding the active section, and a portion of the second semiconductor layer has been removed from the inactive section.

9 Claims, 13 Drawing Sheets

(51) Int. Cl.
  *H01L 29/20*  (2006.01)
  *H01L 29/778*  (2006.01)
  *H01L 29/872*  (2006.01)
  *H01L 29/417*  (2006.01)
  *H01L 29/06*  (2006.01)
  *H01L 21/306*  (2006.01)

(52) U.S. Cl.
  CPC .... *H01L 29/66462* (2013.01); *H01L 29/7787* (2013.01); *H01L 29/872* (2013.01); *H01L 21/30621* (2013.01); *H01L 29/0692* (2013.01)

(58) Field of Classification Search
  CPC ........... H01L 29/66462; H01L 29/7786; H01L 29/7787; H01L 29/0657
  See application file for complete search history.

(56) References Cited

U.S. PATENT DOCUMENTS

| | | | |
|---|---|---|---|
| 2009/0166678 A1* | 7/2009 | Sato | H01L 21/8252 257/194 |
| 2010/0052014 A1 | 3/2010 | Matsushita | |
| 2010/0163928 A1 | 7/2010 | Imada et al. | |
| 2010/0320505 A1* | 12/2010 | Okamoto | H01L 29/045 257/192 |
| 2010/0327293 A1 | 12/2010 | Hikita et al. | |
| 2011/0012173 A1 | 1/2011 | Umeda et al. | |
| 2011/0037101 A1* | 2/2011 | Nakazawa | H01L 27/0605 257/192 |
| 2011/0095335 A1 | 4/2011 | Ishida et al. | |
| 2012/0153355 A1 | 6/2012 | Umeda et al. | |
| 2012/0299011 A1 | 11/2012 | Hikita et al. | |
| 2013/0099324 A1* | 4/2013 | Huang | H01L 29/66522 257/401 |
| 2013/0277680 A1* | 10/2013 | Green | H01L 29/402 257/76 |

FOREIGN PATENT DOCUMENTS

| | | |
|---|---|---|
| JP | 2008-235613 A | 10/2008 |
| JP | 2009-231508 A | 10/2009 |
| JP | 2010-062320 A | 3/2010 |
| JP | 2010-062321 A | 3/2010 |
| JP | 2010-157602 A | 7/2010 |
| WO | 2009/147774 A1 | 12/2009 |
| WO | 2010/001607 A1 | 1/2010 |
| WO | 2011/024367 A1 | 3/2011 |

* cited by examiner

SEMICONDUCTOR DEVICE COMPOSED OF ALGAINN LAYERS WITH INACTIVE REGIONS

CROSS REFERENCE TO RELATED APPLICATION

This is a continuation application of PCT Application No. PCT/JP2012/004590 filed Jul. 19, 2012, designating the United States of America, and claims the benefit of Japanese Application No. 2011-167333, filed Jul. 29, 2011, the disclosures of which, including the specification, drawings and claims, are incorporated herein by reference in their entirety.

TECHNICAL FIELD

The present disclosure relates to a semiconductor device applicable to a power switching element for the use in a power supply circuit of a consumer product such as a TV, and a semiconductor device applicable to a high-frequency power element for the use in a high-frequency circuit of, for example, a base station for mobile telephones.

BACKGROUND ART

In recent years, intense study has been carried out on field effect transistors (FETs) using gallium nitride (GaN) material, for the use as a high-frequency power device or a power switching device. Nitride semiconductor material such as GaN can be used for making a various kinds of mixed crystal such as aluminum nitride and indium nitride. Therefore, as with conventional arsenic semiconductor material such as gallium arsenide (GaAs), nitride semiconductor material can be used for forming a heterojunction. An FET containing a heterojunction can operate at a high speed due to a two-dimensional electron gas with high mobility, which occurs at the heterojunction interface.

FIG. 12 shows a conventional FET using nitride semiconductor material. The semiconductor device 900 has an active section 990 and an inactive section 992. In the active section 990, finger electrodes serving as source electrodes 952, gate electrodes 956 and drain electrodes 954 are formed in a comb-like pattern. In the inactive section 992, a source pad 952a, a drain pad 954a and a gate pad 956a are formed.

FIG. 13 is a cross-sectional view of the semiconductor device 900. The semiconductor device 900 includes: a substrate 910 made of Si for example; a buffer layer 920 formed on the substrate 910; a channel layer 930 made of GaN and formed on the buffer layer 920; a barrier layer 940 made of AlGaN and formed on the channel layer 930, and protective films 950 and 960 formed on the barrier layer 940. Within the protective film 950, the source electrode 952, the gate electrode 956 and the drain electrode 954 are formed. Wiring patterns 962 and 964 are embedded in the protective film 960 so as to be located on the source electrode 952 and the drain electrode 954 respectively.

Commonly, a silicon nitride (SiN) film is used as the protective film 950. This is because silicon nitride prevents the formation of a surface state in the barrier layer 940.

The inactive section 992 formed around the active section 990 has ion implantation layers 932 and 942, which are formed by implanting ions of non-conductive impurities such as boron (B) and iron (Fe) and thereby eliminating channels. As the inactive section 992 is formed by ion implantation, no step occurs between the active section 990 and the inactive section 992. Therefore, it does not happen that the source electrode 952, the gate electrode 956 or the drain electrode 954 is disconnected by a step at the boundary between the active section 990 and the inactive section 992. Consequently, such a structure improves the yield during the process of forming the source electrode 952, the gate electrode 956 and the drain electrode 954.

CITATION LIST

Patent Literature

[Patent Literature 1] Japanese Patent Application Publication No. 2002-359256

[Patent Literature 2] Japanese Patent Application Publication No. 2006-339561

SUMMARY OF INVENTION

Technical Problem

Meanwhile, the conventional semiconductor device described above has a problem in the strength of the adhesion between the uppermost layer of a set of nitride semiconductor layers made of AlGaN and the protective film. Specifically, since the AlGaN contains Al, which is likely to be ionized, the surface of the layer is more likely to be oxidized compared to a layer made of GaN or the like, and this leads to a problem that the protective film does not firmly adhere to the AlGaN layer.

Therefore, under high temperature, high humidity and high bias conditions, the protective film possibly comes off from the uppermost layer of the set of nitride semiconductor layers made of the AlGaN. Such a phenomenon occurs particularly in the periphery of the semiconductor device. Consequently, particularly in the periphery of the semiconductor device, water could enter into the semiconductor device from the gap between the protective film and the set of nitride semiconductor layers, and could cause corrosion of the electrodes or a short circuit between the electrodes. This is a problem of the conventional semiconductor device.

The present invention is made to solve the problem described above, and aims to provide a semiconductor device that is protected against the ingress of water from the interface between the set of nitride semiconductor layers and the protective film in the periphery of the semiconductor device.

Solution to Problem

To achieve the aim, the present disclosure provides a semiconductor device comprising: a substrate; a set of nitride semiconductor layers, including a first semiconductor layer made of GaN or $In_xGa_{1-x}N$ ($0<x\le1$) and formed on the substrate, and a second semiconductor layer containing Al and formed on the first semiconductor layer; and a protective film formed on the set of nitride semiconductor layers, wherein the set of nitride semiconductor layers has an active section and an inactive section surrounding the active section, and a portion of the second semiconductor layer has been removed from the inactive section, or the set of nitride semiconductor layers additionally includes a third semiconductor layer made of GaN or $In_yGa_{1-y}N$ ($0<y\le1$), the third semiconductor layer being inserted between the second semiconductor layer and the protective film.

The set of nitride semiconductor layers may have a step-like section resulting from the removal of the portion of the second semiconductor layer.

The set of nitride semiconductor layers may have a plurality of step-like sections resulting from the removal of the portion of the second semiconductor layer, and upper surfaces of the plurality of step-like sections of the set of nitride semiconductor layers may be located lower than an upper surface of the active section of the set of nitride semiconductor layers.

The set of nitride semiconductor layers may have a step-like section resulting from the insertion of the third semiconductor layer between the second semiconductor layer and the protective film, and an upper surface of the step-like section of the set of nitride semiconductor layers may be located higher than an upper surface of the active section of the set of nitride semiconductor layers.

The inactive section may contain non-conductive impurity ions implanted therein.

Material of the second semiconductor layer may have a larger band gap than material of the first semiconductor layer.

The set of nitride semiconductor layers may have a plurality of step-like sections resulting from the removal of the portion of the second semiconductor layer, and in each of the plurality of step-like sections, an uppermost layer of the set of nitride semiconductor layers may be the first semiconductor layer.

The set of nitride semiconductor layers may have a step-like section resulting from the insertion of the third semiconductor layer between the second semiconductor layer and the protective film, and in the step-like section, an uppermost layer of the set of nitride semiconductor layers may be the third semiconductor layer.

The set of nitride semiconductor layers may have a plurality of step-like sections resulting from the insertion of the third semiconductor layer between the second semiconductor layer and the protective film, each of the plurality of step-like sections may be a convex section or a concave section, and in each convex section, an uppermost layer of the set of nitride semiconductor layers may be the third semiconductor layer inserted between the second semiconductor layer and the protective film, and in each concave section, a portion of the second semiconductor layer may have been removed and an uppermost layer of the set of nitride semiconductor layers may be the first semiconductor layer.

The third semiconductor layer may contain p-type impurities.

The protective film may be made of SiN, AlN or BCN.

Advantageous Effects

In a semiconductor device pertaining to the present disclosure, the protective film and the second semiconductor layer, which is made of material that is more likely to be oxidized than the material of the first semiconductor layer, are not in direct contact with each other.

Since the first semiconductor layer made of GaN or $In_xGa_{1-x}N$ lies under the second semiconductor layer, the protective film is brought into contact with the first semiconductor layer made of GaN or $In_xGa_{1-x}N$ when a portion of the second semiconductor layer is removed. Since the first semiconductor layer does not contain Al, the surface of the first semiconductor layer is unlikely to be oxidized. The surface of the first semiconductor layer is unlikely to be made rough by oxidation. Therefore, the strength of adhesion to the protective film will not be problematic.

Similarly, when the third semiconductor layer made of GaN or $In_yGa_{1-y}N$ (0<y≤1) is inserted between the second semiconductor layer and the protective layer, the strength of adhesion of the third semiconductor layer to the protective film will not be problematic, because the surface of the third semiconductor layer is resistant to oxidation and is unlikely to be made rough by oxidation.

Thus, the present disclosure provides a semiconductor device that is protected against the ingress of water from the interface between the protective layer and the set of nitride semiconductor layers in the periphery of the semiconductor device.

DESCRIPTION OF EMBODIMENTS

Embodiment 1

1. Structure of Semiconductor Device 100

Figure 1:
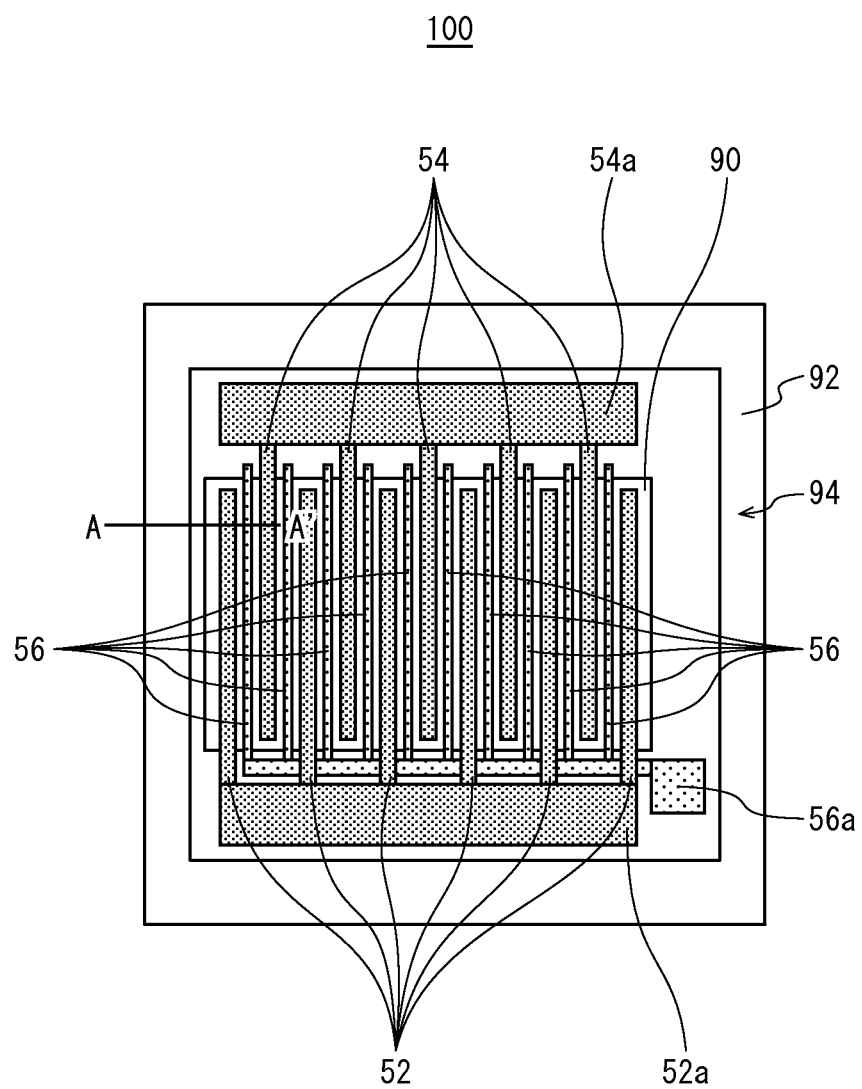
FIG. 1 is a top view of a semiconductor device pertaining to Embodiment 1 of the present invention.

FIG. 1 is a top view of a semiconductor device 100 pertaining to Embodiment 1 of the present invention.

The semiconductor device 100 has an active section 90 where channels exist and an inactive section 92 where no channel exists. The inactive section 92 is located around the active section 90, and has undergone inactivation processing.

In the active section 90, finger electrodes serving as source electrodes 52, gate electrodes 56 and drain electrodes 54 are formed in a parallel, comb-like pattern. Since the source electrodes 52, the gate electrodes 56 and the 56 drain electrodes 54 are arranged in a comb-like pattern, the portions, per unit area, of the electrodes facing each other are elongated, and electric current efficiently flows between the electrodes.

In the inactive section 92, a source pad 52a, a gate pad 56a and a drain pad 54a are formed. In the inactive section 92, a step-like section 94 is also formed so as to surround the active section 90, the source pad 52a, the gate pad 56a and the drain pad 54a.

Figure 2:
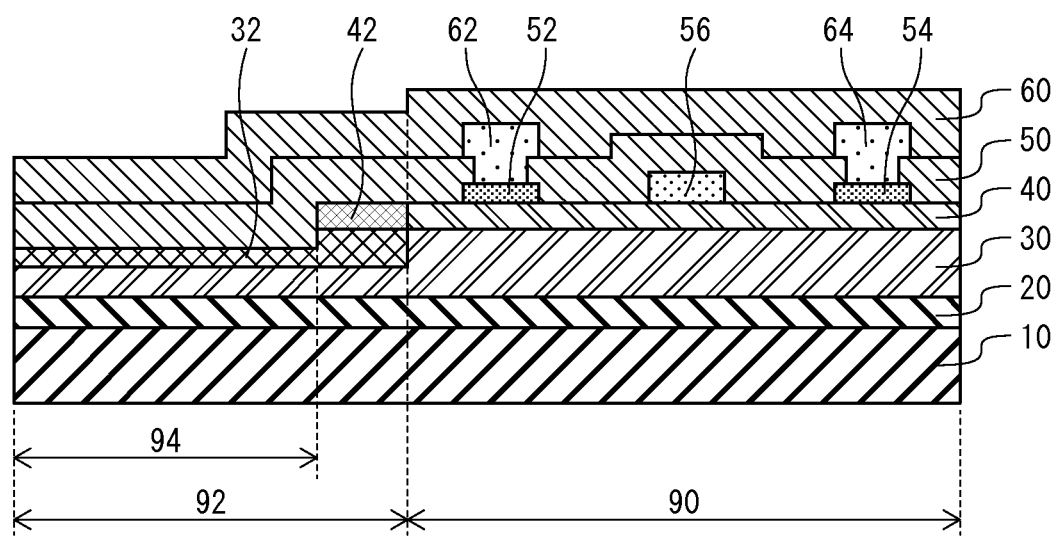
FIG. 2 is a cross-sectional view of the semiconductor device shown in FIG. 1.

FIG. 2 is a cross-sectional view of the semiconductor device 100.

The semiconductor device 100 includes: a substrate 10 made of Si for example; a buffer layer 20 made of AlN and formed on the substrate 10; a channel layer 30 made of undoped GaN and formed on the buffer layer 20; and a barrier layer 40 made of undoped AlGaN (proportion of Al: 25%) and formed on the channel layer 30. Note that AlGaN constituting the barrier layer 40 is more likely to be oxidized and has greater band gap energy compared to GaN constituting the channel layer 30. The buffer layer 20, the channel layer 30 and the barrier layer 40 constitute a set of nitride semiconductor layers.

The active section 90 of the semiconductor device 100 includes: a gate electrode 56 formed on the barrier layer 40, and a source electrode 52 and a drain electrode 54 each formed on the barrier layer 40 and each made of a Ti layer and a Al layer. The source electrode 52 and the drain electrode 54 are connected to the channels formed at the interface between the barrier layer 40 and the channel layer 30, via an Ohmic contact. Here, the term "undoped" means that no impurities are deliberately mixed into the semiconductor material. The channel layer 30 is not necessarily made of GaN, and may be made of $In_xGa_{1-x}N$ ($0<x\leq 1$).

The inactive section 92 includes ion implantation layers 32 and 42, which are formed by implanting ions of B or Fe for example to eliminate the channels. As the inactive section 92 is formed by ion implantation, no step occurs between the active section 90 and the inactive section 92. Therefore, it does not happen that the source electrode 52, the gate electrode 56 or the drain electrode 54 is disconnected by a step at the boundary between the active section 90 and the inactive section 92. Consequently, such a structure improves the yield during the process of forming the source electrode 52, the gate electrode 56 and the drain electrode 54.

Protective films 50 and 60 made of SiN are formed on a portion of the barrier layer 40 where the source electrode 52, the gate electrode 56 and the drain electrode 54 are not formed, and on the ion implantation layers 32 and 42. The protective films 50 and 60 protect the source electrode 52, the gate electrode 56, the drain electrode 54 and the set of nitride semiconductor layers from ingress of water. Wiring patterns 62 and 64 are embedded in the protective film 60 so as to be located on the source electrode 52 and the drain electrode 54 respectively. In the inactive section 92, a step-like section 94 is formed by removing a portion of the barrier layer 40 and a portion of the channel layer 30. Thus, in the step-like section 94, the protective film 50 is prevented from being in contact with the barrier layer 40. The protective film 50 is in contact with the channel layer 30 made of GaN.

As described above, the set of nitride semiconductor layers includes the barrier layer 40 formed on the channel layer 30, and a portion of the barrier layer 40 in the step-like section 94 is removed so that the top surface of the set of nitride semiconductor layers in the step-like section 94 is the channel layer 30 made of GaN. In addition, the top surface of the channel layer 30 in the step-like section 94 is located at a lower level than the top surface of the barrier layer 40 in the active section 90.

The buffer layer 20 has a thickness of 100 nm for example. The channel layer 30 has a thickness of 2 μm for example. The barrier layer 40 has a thickness of 25 nm for example.

2. Strength of Adhesion Between Protective Film 50 and Set of Nitride Semiconductor Layers Nitride semiconductor material such as GaN has a smaller lattice constant and a larger band gap than other semiconductor material such as GaAs. Therefore, nitride semiconductor material such as GaN has a high melting point than other semiconductor material such as GaAs. However, since AlGaN contains Al, which is likely to be ionized, the surface of an AlGaN layer is more likely to be oxidized compared to a GaN layer.

When the surface of a set of a nitride semiconductor layers is oxidized and rough, the strength of the adhesion between the set of nitride semiconductor layers and the protective film 50, made of SiN and formed on the surface of the set of nitride semiconductor layers, is smaller compared to when the surface of the set of nitride semiconductor layers is not oxidized and flat. Since GaN is resistant to such surface oxidation, the channel layer 30 made of GaN more strongly adheres to the protective film 50 made of SiN than the barrier layer 40 made of AlGaN does.

Instead of GaN, InGaN (indium gallium nitride) may be used as the material of the channel layer 30. Since In is more resistant to oxidation than Ga, InGaN serves as a nitride semiconductor material that is resistant to surface oxidation. Therefore, the channel layer 30 made of InGaN strongly adheres to the protective film 50.

Note that the channel layer 30 made of GaN and the barrier layer 40 made of AlGaN are integrated as one piece, because these layers are formed by epitaxial growth.

3. Protective Film 50

As described above, the protective film 50 is made of SiN. This is for the purpose of reducing the density of the surface state of the barrier layer 40 in the active section 90 and avoiding current collapse due to the surface state. The current collapse is a phenomenon in which the drain current will be small and the on-resistance will be large when the gate is switched from OFF to ON immediately after a high drain voltage is applied, compared to when the drain voltage is not applied. When the current collapse occurs, it could be possible that a desired drain current cannot be obtained even when a high drain voltage is applied.

Instead of SiN, AlN (aluminum nitride) or B—C—N (boron-carbon-nitride) material may be used as the material of the protective film 50 for reducing the density of the surface state of the barrier layer 40 made of nitride semiconductor material. The SiN film, the AlN film and the B—C—N film are all nitride insulators. Each of these films does not oxidize the surface of the set of nitride semiconductor layers when deposited on the surface, and therefore strongly adheres to the GaN or InGaN layer.

4. Effects

Compared to the barrier layer 40 made of AlGaN, the channel layer 30 made of GaN is more resistant to surface oxidation, and more strongly adheres to the protective film 50 made of SiN. Therefore, it is possible to improve the adhesion of the protective film 50 to the set of nitride semiconductor layers in the periphery of the semiconductor device 100 by forming the protective film 50 made of SiN and the channel layer 30 made of GaN to be in contact with each other in the step-like section 94 formed to surround the active section 90, the source pad 52a, the gate pad 56a and the drain pad 54a. This structure prevents the protective film 50 from peeling from the surface of the set of nitride semiconductor layers in the step-like section 94, prevents ingress of water from the periphery of the semiconductor device 100, and thereby improves the reliability of the semiconductor device 100.

5. Method of Manufacturing Semiconductor Device 100

Figure 3A:
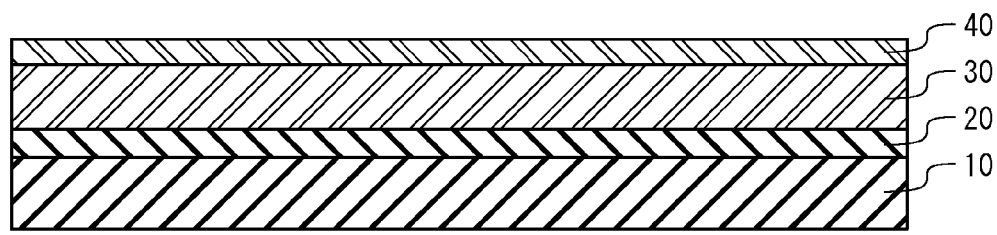
FIGS. 3A through 3E show a method of manufacturing the semiconductor device shown in FIG. 1.

As shown in FIG. 3A, the buffer layer 20 made of AN, the channel layer 30 made of GaN and the barrier layer 40 made of AlGaN are sequentially formed by epitaxial growth on the surface of the Si substrate 10. For example metal organic chemical vapor deposition (MOCVD) may be used for the epitaxial growth. Note that the substrate 10 may be made of any material in so far as a nitride semiconductor can be formed thereon. For example, sapphire or SiC may be used as the material of the substrate 10.

Figure 3B:
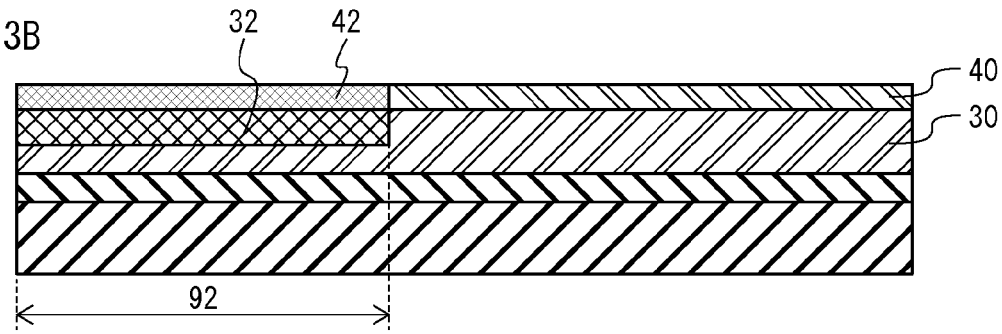

As shown in FIG. 3B, an ion implantation layer 32 is formed by implanting B or Fe ions into the channel layer 30 so as to eliminate unnecessary channels. Similarly, an ion implantation 42 is formed by implanting B or Fe ions into the barrier layer 40. The region including the ion implantation layers 32 and 42 are referred to as the inactive section 92.

Figure 3C:
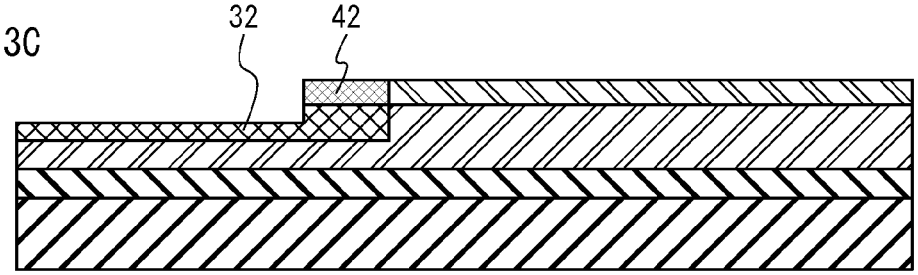

As shown in FIG. 3C, portions of the ion implantation layers 32 and 42 in the inactive section 92 are removed by dry etching such as inductive-coupled plasma (ICP) etching using a chlorine gas, so that the ion implantation layer 32 is exposed. This dry etching step may be performed before the formation of the inactive section 92 by ion implantation shown in FIG. 3B.

Figure 3D:
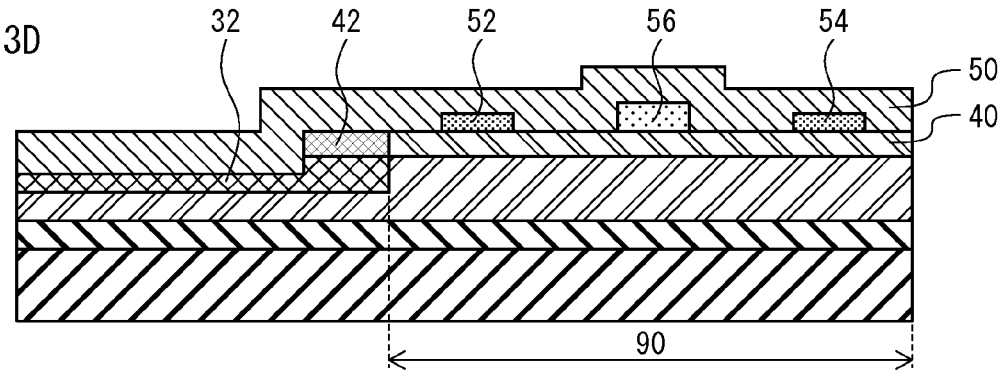

Subsequently, as shown in FIG. 3D, a Ti layer and a Al layer are formed on the barrier layer 40 in the active section 90, and thermal processing is performed at 650° C. in a nitrogen atmosphere. As a result, the source electrode 52 and the drain electrode 54 are formed. Next, the gate electrode 56 made of Ni is formed between the source electrode 52 and the drain electrode 54 on the barrier layer 40.

Figure 3E:
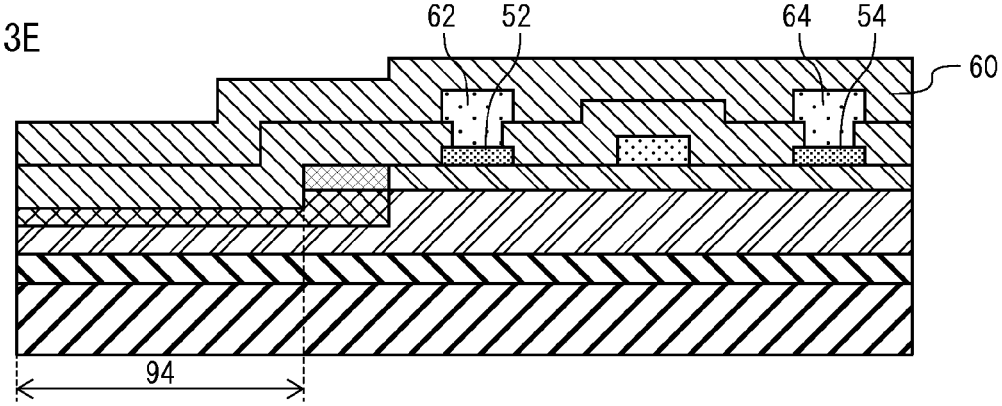

As shown in FIG. 3E, portions of the protective film 50 located on the source electrode 52 and the drain electrode 54 are removed by dry etching and thus apertures are formed. Then, the wiring patterns 62 and 64 are formed in the apertures. Subsequently, the protective film 60, made of SiN for example, is formed to cover the protective film 50 and the wiring patterns 62 and 64, and a portion of the protective film 60 located on the electrode pad is removed by dry etching and thus an aperture is formed.

Note that the area on which the dry etching for exposing a portion of the ion implantation layer 32 is performed is not limited to the periphery of the semiconductor device 100. The dry etching may be simultaneously performed on the areas expected to be located immediately under the source electrode 52 and the drain electrode 54. By such dry etching, a so-called Ohmic recess structure is formed at the same time, and the source electrode 52 and the drain electrode 54 are brought into direct contact with the side walls of the Ohmic recess structure, and channels are formed at the interface between the channel layer 30 and the barrier layer 40. Such a structure allows for reduction of the contact resistance between the electrodes and the channels without any additional step.

6. Modification Examples (6-1) Structure of Semiconductor Device 200

Figure 4:
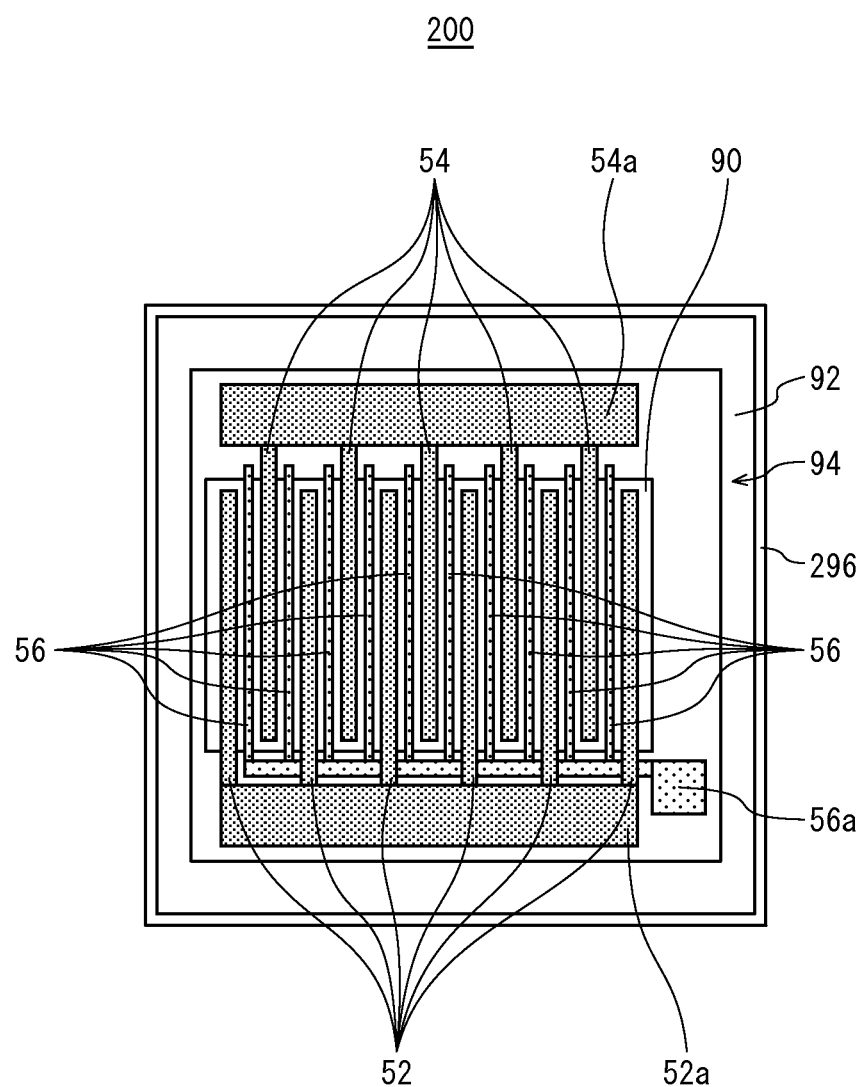
FIG. 4 is a top view of a semiconductor device pertaining to Modification 1.
Figure 5:
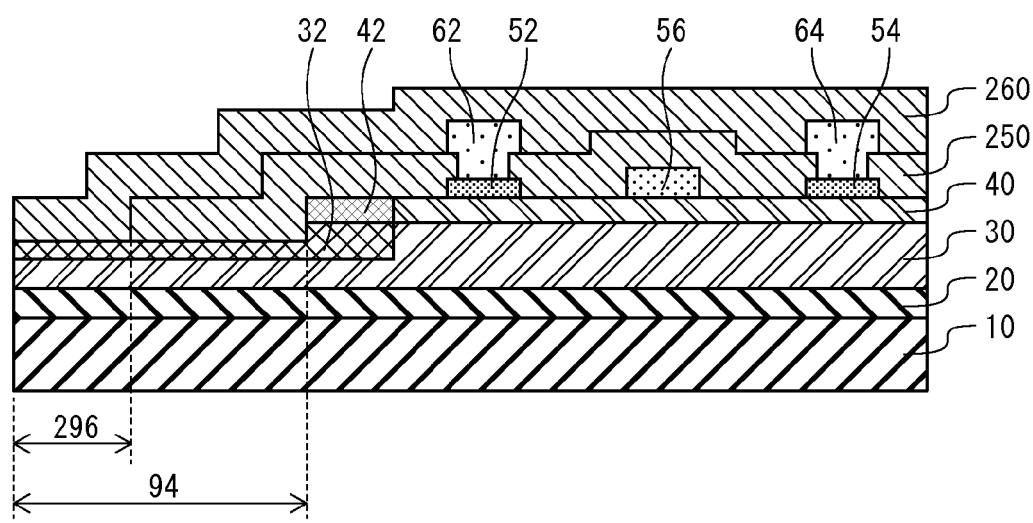
FIG. 5 is a cross-sectional view of the semiconductor device shown in FIG. 4.

FIG. 4 is a top view of a semiconductor device pertaining to a first modification of Embodiment 1 of the present invention, and FIG. 5 is a cross-sectional view of the same. The semiconductor device 200 includes a protective film 250 made of AlN, which is in contact with the set of nitride semiconductor layers. In the semiconductor device 200, a portion of the protective film 250 in a region 296 of the step-like section 94 has been removed.

Here, the protective film 250 made of AlN is likely to be oxidized because of Al which is likely to be ionized. Therefore, in the periphery of the semiconductor device 200, it is necessary to prevent the protective film 250 from being oxidized at its surface and being peeled from the surface of the set nitride semiconductor layers, in order to prevent the ingress of water. For this purpose, a portion of the protective film 250 made of AN in the step-like section 94 is removed, and the periphery of the semiconductor device 220 is coated with a protective film 260 made of Sin after the removal of the portion of the protective film 250.

(6-2) Effects of Semiconductor Device 200

In the periphery of the semiconductor device 200 after portions of the protective film 250 made of AlN susceptive to surface oxidation has been removed, the surface of the set of the nitride semiconductor layers is in contact with the protective film 260 which is resistant to surface oxidation. Therefore, even when the protective film 250 made of AlN which is susceptive to surface oxidation is used, the decrease in strength of adhesion of the protective film 250 to the surface of the set of the nitride semiconductor layers due to oxidation of the protective film 250, is prevented. Consequently, this structure prevents ingress of water from the interface between the protective film 250 and the set of the nitride semiconductor layers.

(6-3) Structure of Semiconductor Device 300

Figure 6:
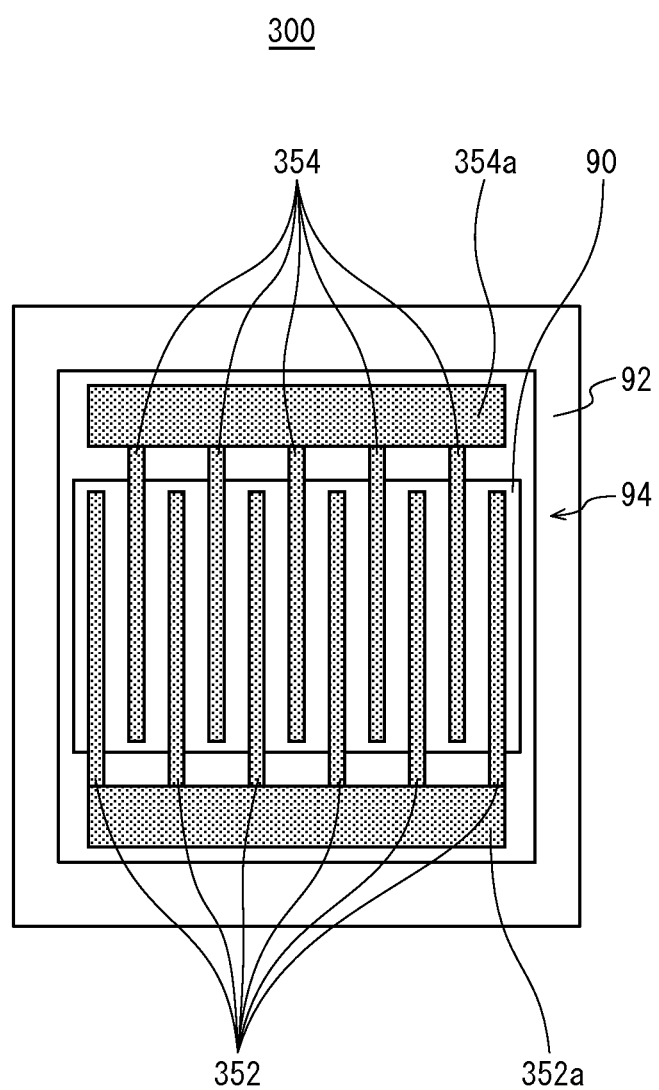
FIG. 6 is a top view of a semiconductor device pertaining to Modification 2.
Figure 7:
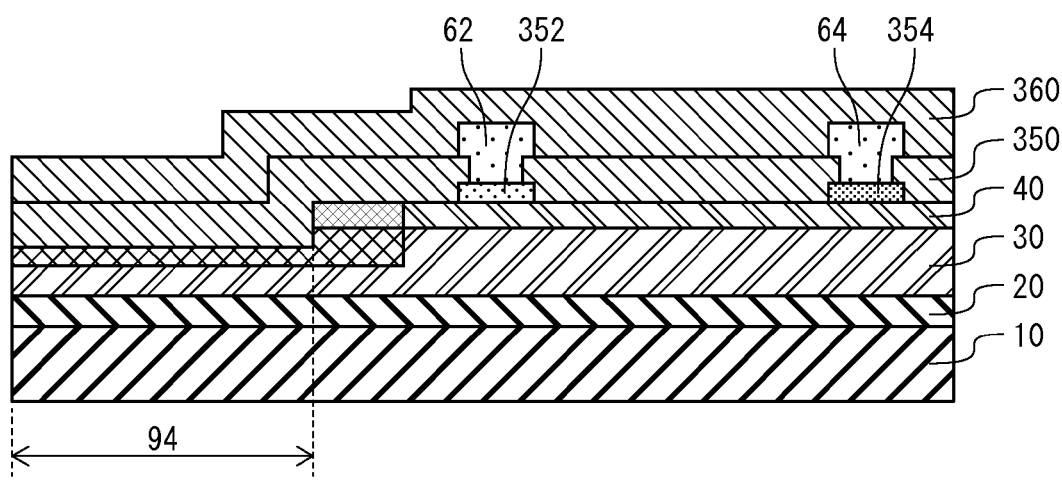
FIG. 7 is a cross-sectional view of the semiconductor device shown in FIG. 6.

FIG. 6 is a top view of a semiconductor device pertaining to a second modification of Embodiment 1 of the present invention, and FIG. 7 is a cross-sectional view of the same. The semiconductor device 300 is a diode including a barrier layer 40 and an anode electrode 352 made of Ni and a cathode electrode 354 composed of a Ti layer and a Al layer formed on the anode electrode 352. As with the embodiments above, the inactive section 92 of the semiconductor device 300 includes the ion implantation layers 32 and 42, which are formed by implanting ions of B or Fe for example to eliminate the channels. In the inactive section 92, a step-like section 94 is formed by removing a portion of the barrier layer 40. In the step-like section 94, the protective film 50 is in contact with the channel layer 30.

(6-4) Effects of Semiconductor Device 300

As the protective film 50 is in contact with the channel layer 30, the adhesion between the protective film 50 and the set of nitride semiconductor layers in the periphery of the semiconductor device 300 is stronger compared to the case the protective film 50 is in contact with the barrier layer 40. This structure prevents ingress of water from the interface between the protective film 50 and the set of nitride semiconductor layers, particularly in the periphery of the semiconductor device 300.

Embodiment 2

1. Structure of Semiconductor Device 400

Figure 8:
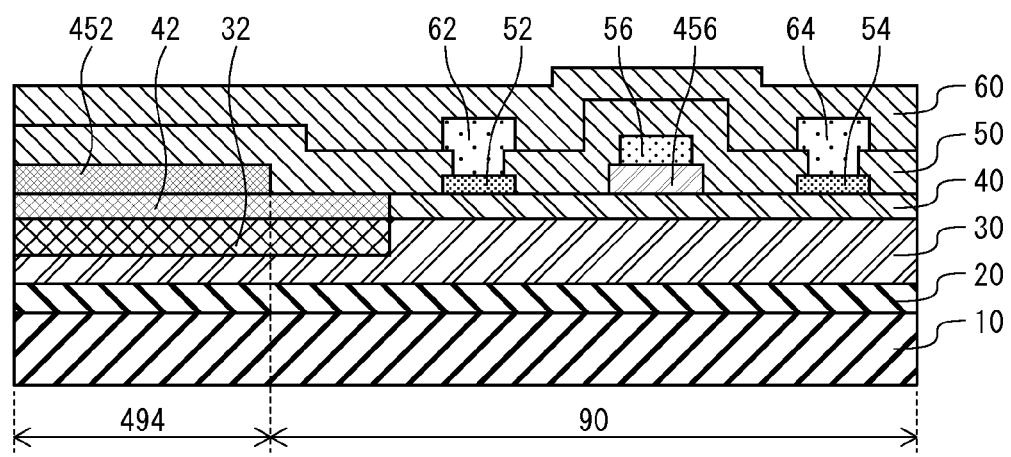
FIG. 8 is a cross-sectional view of a semiconductor device pertaining to Embodiment 2 of the present invention.

FIG. 8 is a cross-sectional view of a semiconductor device 400 pertaining to Embodiment 2 of the present invention. The semiconductor device 400 has the same structure as the semiconductor device 100 except for the following.

As shown in FIG. 8, an ion implantation layer 452, which is more resistant to oxidation than the barrier layer 40, is formed on the ion implantation layer 42, and a p-type GaN layer 456 is inserted between the barrier layer 40 and the gate electrode 56. Due to the ion implantation layer 452, a step-like section 494 is formed. In the step-like section 494, the protective film 50 is prevented from being in direct contact with the barrier layer 40. The ion implantation layer 452 and the p-type GaN layer 456 have a thickness of 100 nm. The material of the ion implantation layer 452 and the p-type GaN layer 456 is GaN or $In_yGa_{1-y}N$ (0<y≤1), for example.

Since the ion implantation layer 452 is formed on the ion implantation layer 42 contained in the barrier layer 40 in the step-like section 494, the top layer of the set of nitride semiconductor layers in the step-like section 494 is the ion implantation layer 452. In addition, the top surface of the set of nitride semiconductor layers is located at a higher level in the step-like section 494 than in the active section 90.

2. Effects

Unlike the semiconductor device 100, the adhesion between the protective film 50 and the nitride semiconductor layer of the semiconductor device 400 is improved without removing a portion of the AlGaN layer 40 in the step-like section 94. Also, it is unnecessary to add a step for forming the step-like section 494, because the step-like section 494 is formed at the same time as the formation of the p-type GaN layer 456 under the gate electrode 56.

Furthermore, the p-type GaN layer 456 formed under the gate electrode 56 selectively eliminates channels immediately under the gate electrode 56. Therefore, the stated structure realizes a normally-off device. In addition, since a p-n junction having a greater energy barrier than a Schottky barrier junction is formed at the gate, the stated structure reduces the gate leakage current.

3. Method of Manufacturing Semiconductor Device 400

Figure 9A:
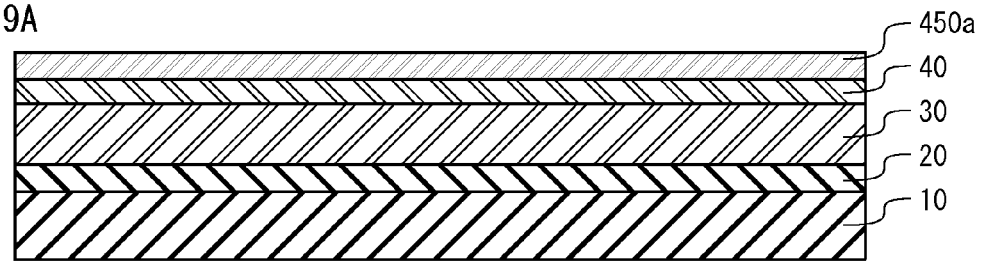
FIGS. 9A through 9E show a method of manufacturing the semiconductor device shown in FIG. 8.

First, as shown in FIG. 9A, the buffer layer 20 made of AlN, the channel layer 30 made of GaN, the barrier layer 40 made of AlGaN and a p-type GaN layer 450a are sequentially formed by epitaxial growth on the surface of the Si substrate 10.

Figure 9B:
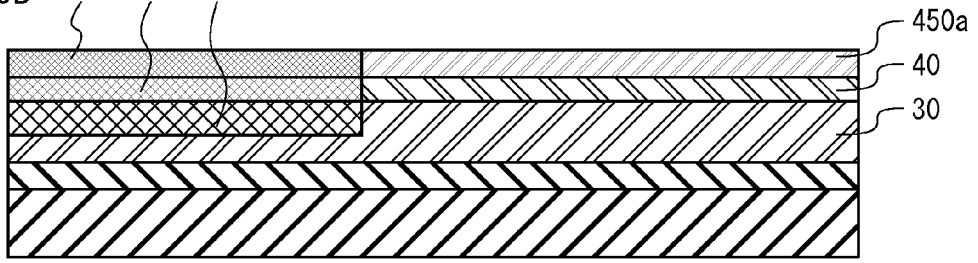

As shown in FIG. 9B, ion implantation layers 32, 42 and 452 are formed by implanting B or Fe ions into the channel layer 30 so as to eliminate unnecessary channels. The rejoin including the ion implantation layers 32, 42 and 452 is defined as an inactive section 92.

Figure 9C:
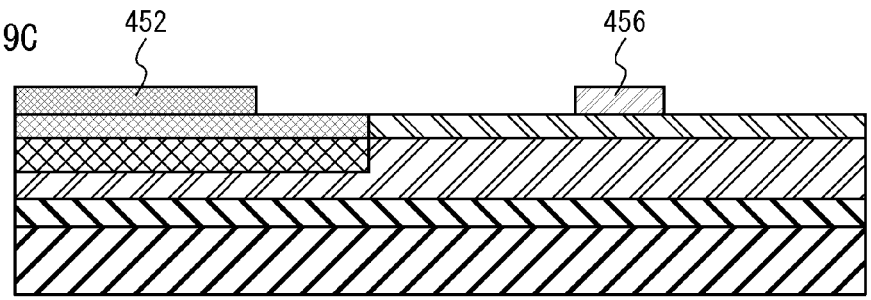

As shown in FIG. 9C, a portion of the p-type GaN layer 450a is removed by dry etching such as ICP etching. At this point, it is preferable that the etching rate for the barrier layer 40 is set lower than the etching rate for the channel layer 30 by performing selective dry etching using a chlorine gas with an oxygen gas added. This dry etching step may be performed before the formation of the inactive section 92 by ion implantation.

Figure 9D:
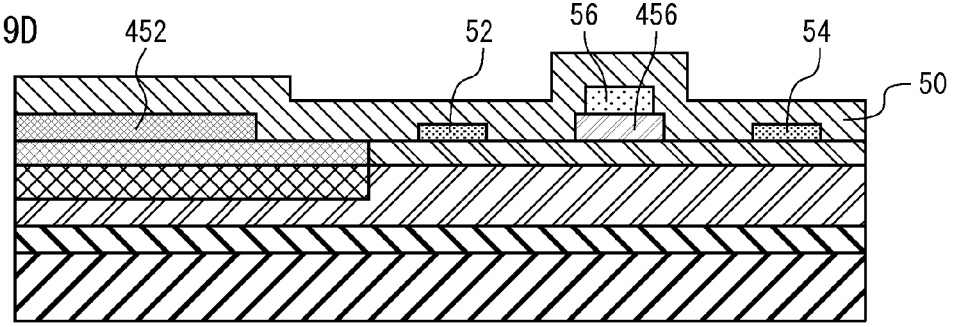

Next, as shown in FIG. 9D, after the formation of the source electrode 52 and the drain electrode 54, a gate electrode 56 made for example of Pd is formed on the p-type GaN layer 456. Subsequently, the protective film 50 made of SiN is formed by a plasma CVD method.

Figure 9E:
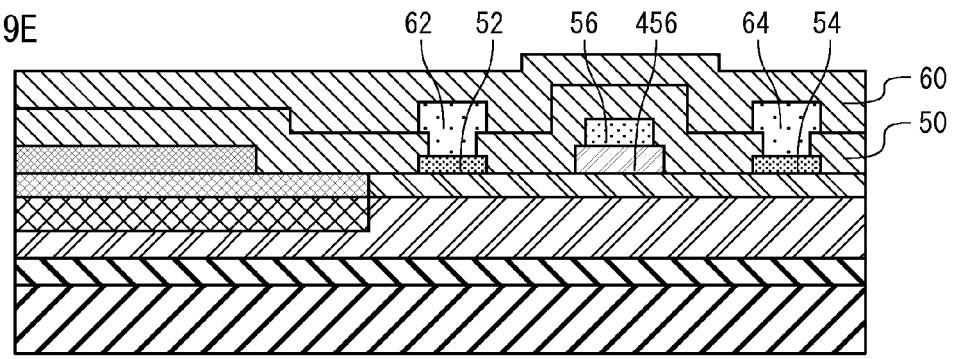

As shown in FIG. 9E, portions of the protective film 50 located on the source electrode 52 and the drain electrode 54 are removed by dry etching and thus apertures are formed. Then, the wiring patterns 62 and 64 are formed in the apertures. Subsequently, the protective film 60 made for example of SiN is formed and a portion of the protective film 60 located on the electrode pad is removed by dry etching and thus an aperture is formed.

Embodiment 3

1. Structure of Semiconductor Device 500

Figure 10:
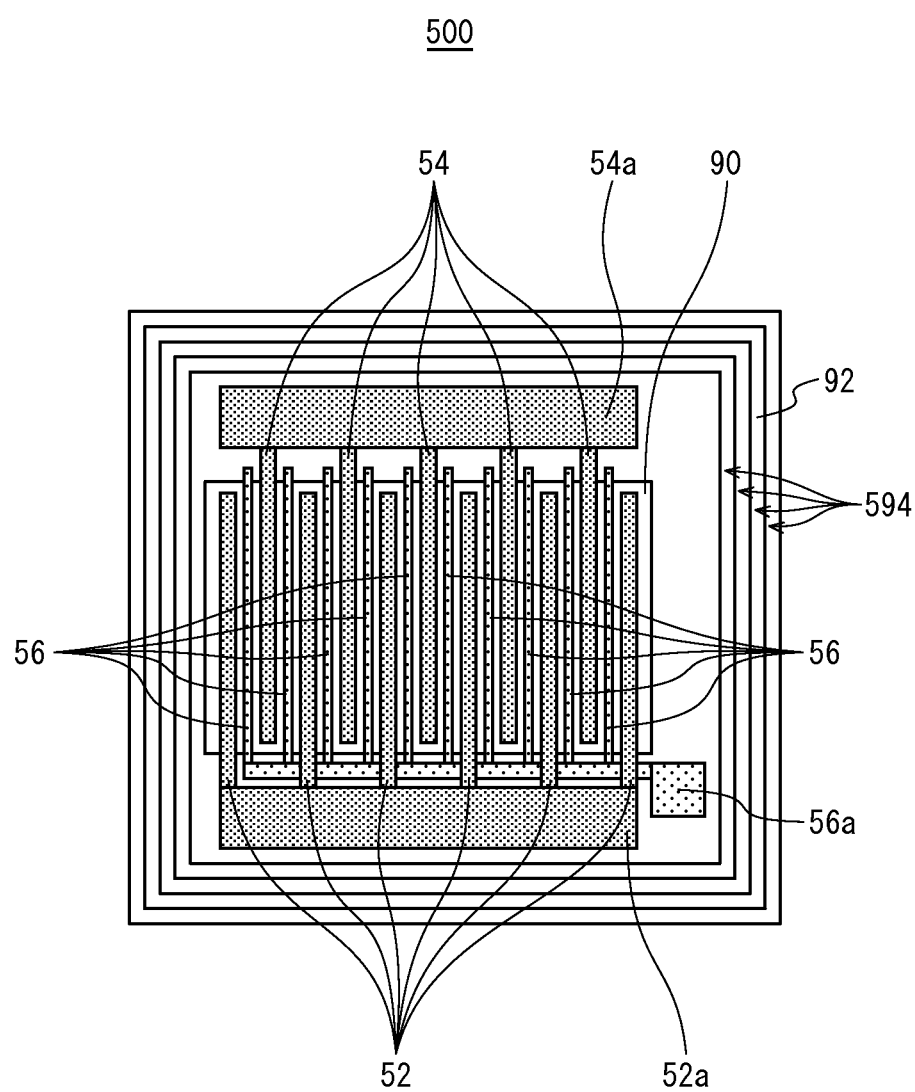
FIG. 10 is a top view of a semiconductor device pertaining to Embodiment 3 of the present invention.
Figure 11:
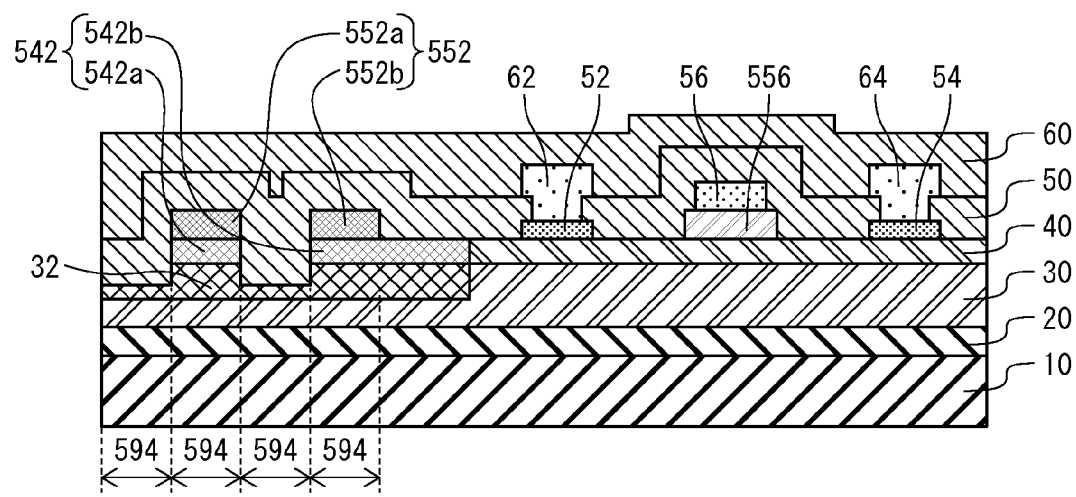
FIG. 11 is a cross-sectional view of the semiconductor device shown in FIG. 10.
Figure 12:
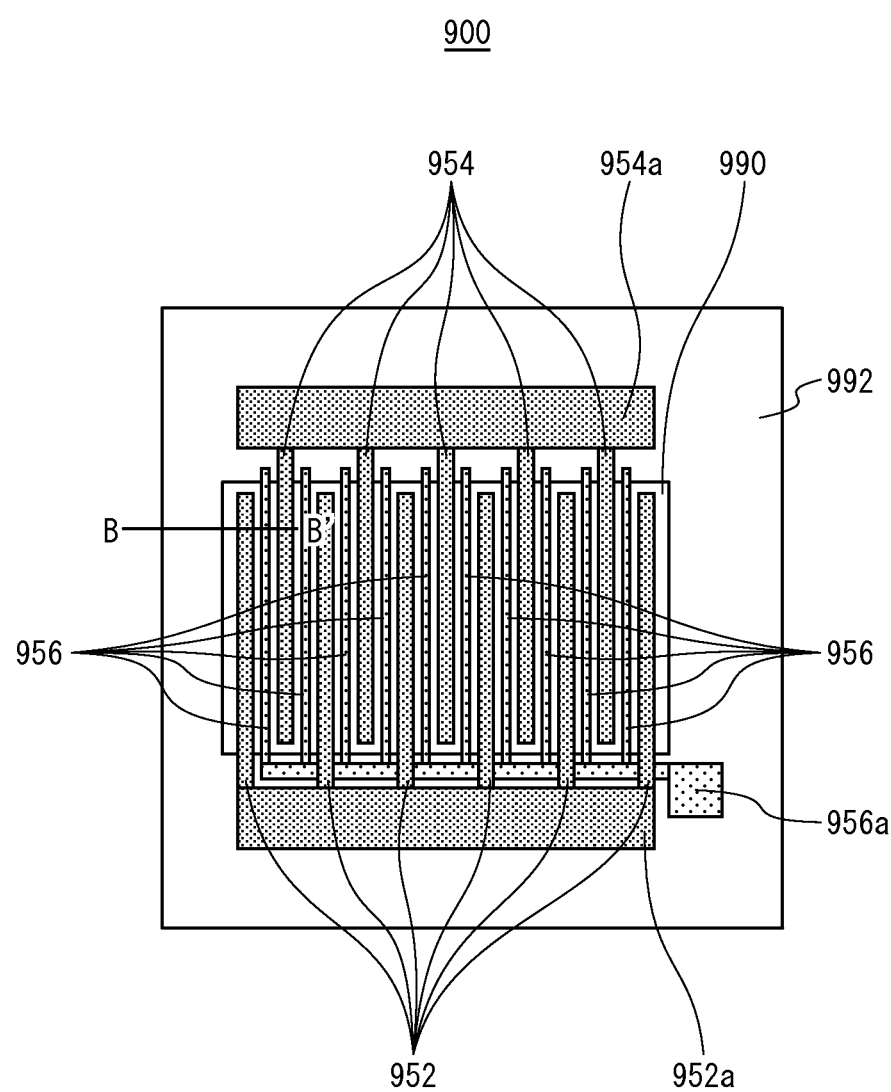
FIG. 12 is a top view of a conventional semiconductor device.
Figure 13:
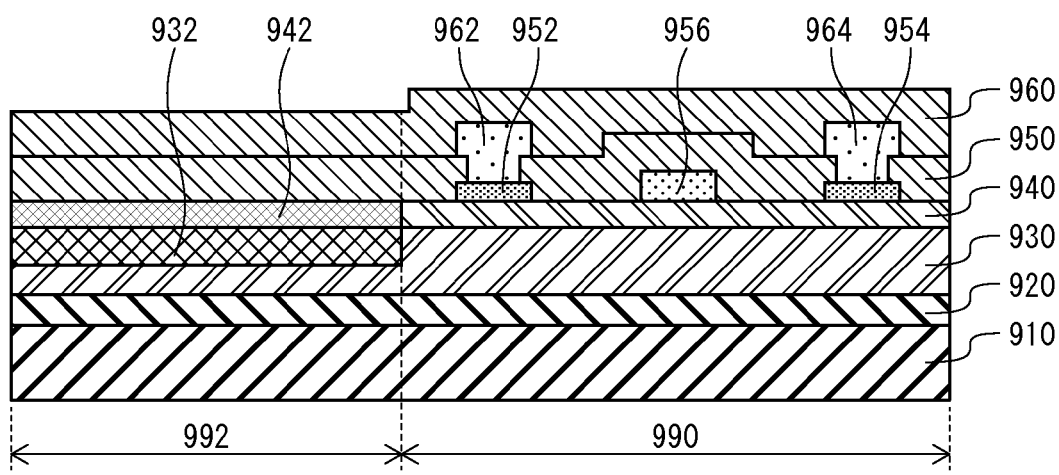
FIG. 13 is a cross-sectional view of the semiconductor device shown in FIG. 12.

FIG. 10 is a top view of a semiconductor device 500 pertaining to Embodiment 3 of the present invention, and FIG. 11 is a cross-sectional view of the same. The semiconductor device 500 has the same structure as the semiconductor device 100 except for the following.

In the semiconductor device 500, a p-type GaN layer 552 is inserted between the ion implantation layer 542 (portions 542a and 542b) in the barrier layer 40 and the protective film 50, and a plurality of step-like sections 594 are formed to surround the active section 90, the source pad 52a, the drain pad 54a and the gate pad 56a. As shown in FIG. 10, each step-like section 594 is either a portion of the p-type GaN layer 552 left without being removed, or an exposed portion of the channel layer 30 from the surface of which a portion of the p-type GaN layer 552 and a portion of the barrier layer 40 have been removed. These portions are alternately arranged, and thus the step-like sections 594 are formed.

Specifically, a convexity or a concavity is formed in each of the step-like sections 594, and the set of nitride semiconductor layers contain two portions (552a and 552b) of the p-type GaN layer 552. The channel layer 30 contained in the set of nitride semiconductor layers is covered with the barrier layer 40. Since the portions 552a and 552b of the p-type GaN layer 552 is partially inserted between the barrier layer 40 and the protective film 50, the top layer of the set of nitride semiconductor layers at each convexity is the p-type GaN layer 552. Similarly, since portions of the barrier layer 40 have been removed, the top layer of the set of nitride semiconductor layers at each concavity is the channel layer 30.

2. Effects

Since the surface of the channel layer 30 made of GaN strongly adhering to the protective film 50 is exposed and the plurality of step-like sections 594 are provided, the surface areas of the protective film 50 and the set of nitride semiconductor layers are increased in the periphery of the semiconductor device 500. Therefore, the stated structure is effective for preventing ingress of water from the interface between the protective film 50 and the set of nitride semiconductor layers.

Furthermore, since the protective film 50 is unlikely to peel off from the step-like sections 594 composed of the remaining portions of the p-type GaN layer 552, the stated structure prevents ingress of water even under high temperature, high humidity and high bias conditions.

[Modifications]

1. Material of Barrier Layer

In embodiments and so on, an AlGaN film is used as the barrier layer. However, the present invention should not be limited in this way. The effects of the present invention can be achieved by forming the barrier layer from a material that generates channels when brought into contact with a semiconductor layer made of GaN or $In_xGa_{1-x}N$ (0<x≤1), and that contains atoms that are likely to be ionized and likely to cause surface oxidation. For example, InAlGaN may be used.

2. About Embodiment 2

According to Embodiment 2, the p-type GaN layer made of GaN or $In_yGa_{1-y}N$ (0<y≤1) are formed at the same time as the formation of the step-like section. However, the present invention should not be limited in this way, and the p-type GaN layer and the step-like section may be formed separately. When the p-type GaN layer and the step-like section are formed separately, they may be made of different materials. For example, a p-type InGaN layer may be formed under the gate, and a GaN layer may be formed on the barrier layer in the step-like section.

3. Other Modifications

The structure of a semiconductor device pertaining to the present invention should not be limited to any of the specific structures of the semiconductor devices according to the embodiments and the modification examples described above. The structure may be modified in various manners in so far as the invention achieves the advantageous effects. Also, each step of the manufacturing method may be replaced with another equivalent step in so far as the technical concept of the present invention is fulfilled. In addition, the order of the steps and the materials may be changed.

INDUSTRIAL APPLICABILITY

The semiconductor device pertaining to the present disclosure realizes a reliable transistor protected against ingress of water, which is useful as a power switching element for the use in a power supply circuit of a consumer product such as a TV, and a high-frequency power element for the use in a high-frequency circuit of, for example, a base station for mobile telephones.

REFERENCE SIGNS LIST 10, 910: Substrate
20, 920: Buffer layer
30, 930: Channel layer
40, 940: Barrier layer
52, 952: Source electrode
54, 954: Drain electrode
56, 956: Gate electrode
50, 60, 250, 260, 950, 960: Protective film
90, 990: Active section
90, 992: Inactive section
94, 494, 594: Step-like section
32, 42, 452, 542, 552, 932, 942: Ion implantation layer
450a, 456, 552: P-type GaN layer
100, 200, 300, 400, 500, 900: Semiconductor device

The invention claimed is:

1. A semiconductor device comprising:
 a substrate;
 a set of nitride semiconductor layers, including:
  a first semiconductor layer made of $In_xGa_{1-x}N$ ($0 \leq x \leq 1$) and formed on the substrate, and
  a second semiconductor layer containing Al and nitrogen, and formed on the first semiconductor layer;
 a third semiconductor layer made of $In_yGa_{1-y}N$ ($0 \leq y \leq 1$) and formed on the set of nitride semiconductor layers; and
 a protective film formed on the third semiconductor layer, wherein
 when viewed in plan, the set of nitride semiconductor layers has an active section and an inactive section surrounding the active section, the active section being a section where channels exist, the inactive section being a section where no channels exist, and
 in the inactive section, the third semiconductor layer is in contact with each of the second semiconductor layer and the protective film,
 when viewed in cross-section, the third semiconductor layer is in contact with the protective film in the inactive section both in a vertical direction and in a horizontal direction,
 the protective film has a first portion which is in contact with the third semiconductor layer in the vertical direction and a second portion which is in contact with the third semiconductor layer in the horizontal direction,
 the first portion and the second portion of the protective film being formed in a single, continuous layer.

2. The semiconductor device of claim 1, further comprising electrode pads, wherein when viewed in plan, the third semiconductor layer in the inactive section continuously surrounds the active section and the electrode pads.

3. The semiconductor device of claim 1, further comprising:
 an electrode being disposed in both of the active section and the inactive section, and
 an electrode pad being disposed in the inactive section,
 wherein the electrode is arranged in a comb-like pattern, and has some finger electrodes,
 wherein the electrode pad is electrically connected to some finger electrodes.

4. The semiconductor device of claim 3, wherein the third semiconductor layer disposed in the inactive section contains p-type impurities.

5. The semiconductor device of claim 3, wherein the third semiconductor layer disposed in the inactive section is a p-type semiconductor.

6. The semiconductor device of claim 3, further comprising:
 a fourth semiconductor layer made of $In_zGa_{1-z}N$ ($0 \leq z \leq 1$), containing p-type impurities, the fourth semiconductor layer being selectively formed on the active section of the set of nitride semiconductor layers,
 wherein the third semiconductor layer disposed in the inactive section contains the same elements as the fourth semiconductor layer containing p-type impurities, and has the same thickness as the fourth semiconductor layer.

7. The semiconductor device of claim 3, wherein a material of the second semiconductor layer has a greater band gap energy than a material of the first semiconductor layer has.

8. The semiconductor device of claim 3, wherein the inactive section contains non-conductive impurities.

9. The semiconductor device of claim 3, wherein the protective film is made of one of SiN, AlN, and BCN.

* * * * *